(12) United States Patent
Jow et al.

(10) Patent No.: US 8,179,695 B2
(45) Date of Patent: *May 15, 2012

(54) MIRROR IMAGE SHIELDING STRUCTURE

(75) Inventors: Uei-Ming Jow, Hsinchu (TW);
Chin-Sun Shyu, Hsinchu (TW);
Chang-Sheng Chen, Hsinchu (TW);
Min-Lin Lee, Hsinchu (TW);
Shinn-Juh Lai, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/783,478

(22) Filed: May 19, 2010

(65) Prior Publication Data

US 2010/0226112 A1 Sep. 9, 2010

Related U.S. Application Data

(62) Division of application No. 11/451,292, filed on Jun. 12, 2006, now Pat. No. 7,764,512.

(30) Foreign Application Priority Data

Jan. 25, 2006 (TW) .............................. 95102900 A

(51) Int. Cl.
*H05K 9/00* (2006.01)

(52) U.S. Cl. ........ 361/816; 361/799; 361/800; 361/818; 361/821; 174/36; 174/258; 174/350; 174/357; 257/659

(58) Field of Classification Search .................. 361/816, 361/763, 818, 821, 799, 800; 174/36, 258, 174/350, 357; 257/659
See application file for complete search history.

(56) References Cited

U.S. PATENT DOCUMENTS

| | | | |
|---|---|---|---|
| 4,801,905 A | 1/1989 | Becker | |
| 5,151,770 A * | 9/1992 | Inoue | 257/660 |
| 5,426,399 A | 6/1995 | Matsubayashi et al. | |
| 5,497,028 A | 3/1996 | Ikeda et al. | |
| 5,596,804 A * | 1/1997 | Hogge et al. | 29/840 |
| 5,677,515 A * | 10/1997 | Selk et al. | 174/255 |
| 5,838,551 A * | 11/1998 | Chan | 361/818 |
| 5,892,668 A * | 4/1999 | Okamoto et al. | 363/40 |
| 5,969,590 A | 10/1999 | Gutierrez | |
| 6,066,537 A | 5/2000 | Poh | |
| 6,310,387 B1 * | 10/2001 | Seefeldt et al. | 257/531 |
| 6,317,965 B1 * | 11/2001 | Okamoto et al. | 29/602.1 |
| 6,489,663 B2 * | 12/2002 | Ballantine et al. | 257/531 |
| 6,556,420 B1 | 4/2003 | Naito et al. | |
| 6,621,400 B2 * | 9/2003 | Horie | 336/200 |
| 6,667,549 B2 * | 12/2003 | Cahill | 257/728 |
| 6,731,513 B2 * | 5/2004 | Rodgers et al. | 361/777 |
| 6,765,298 B2 * | 7/2004 | Chin et al. | 257/776 |

(Continued)

*Primary Examiner* — Angel R Estrada
*Assistant Examiner* — Dimary Lopez
(74) *Attorney, Agent, or Firm* — Morris Manning & Martin LLP; Tim Tingkang Xia, Esq.

(57) ABSTRACT

A mirror image shielding structure is provided, which includes an electronic element and a ground shielding plane below the electronic element. The shape of the ground shielding plane is identical to the projection shape of the electronic element, and the horizontal size of the ground shielding plane is greater than or equal to that of the electronic element. Thus, the parasitic effect between the electronic element and the ground shielding plane is effectively reduced, and the vertical coupling effect between electronic elements is also reduced. Furthermore, the vertical impact on the signal integrity of the embedded elements caused by the layout of the transmission lines is prevented.

16 Claims, 13 Drawing Sheets

U.S. PATENT DOCUMENTS

| | | | |
|---|---|---|---|
| 6,998,939 B2 * | 2/2006 | Nakayama et al. | 333/181 |
| 7,030,455 B2 * | 4/2006 | Gamand et al. | 257/508 |
| 7,186,924 B2 * | 3/2007 | Geva et al. | 174/258 |
| 7,196,595 B2 * | 3/2007 | Tsai et al. | 333/134 |
| 2002/0060090 A1 | 5/2002 | Ozeki et al. | |
| 2003/0107056 A1 | 6/2003 | Chin et al. | |
| 2005/0082087 A1 | 4/2005 | Geva et al. | |

* cited by examiner

MIRROR IMAGE SHIELDING STRUCTURE

CROSS-REFERENCE TO RELATED APPLICATIONS

This application is a divisional application of, and claims benefit of U.S. patent application Ser. No. 11/451,292, filed Jun. 12, 2006, entitled "Mirror Image Shielding Structure," by Uei-Ming Jow et al., which status is allowed, the disclosure of which is hereby incorporated herein in its entirety by reference. U.S. patent application Ser. No. 11/451,292 itself claims priority under 35 U.S.C. §119(a) on Patent Application No. 095102900 filed in Taiwan, R.O.C. on Jan. 25, 2006, the entire contents of which are hereby incorporated by reference.

BACKGROUND OF THE INVENTION

1. Field of Invention

The present invention relates to a shielding structure, and more particularly, to a mirror image shielding structure.

2. Related Art

Conventionally, passive components are disposed on the surface of the common printed circuit board (PCB) or on the surface of the substrate of semiconductor chips. However, with the development trend towards high functionality and small size of electronic products, the lamination technique for circuit boards has come to require the features of thin thickness, multiple layers, and high-density, and so on. Therefore, to create more space and to improve the multi-functionality of the module in a limited substrate area, the circuit layout has been shortened and the signal transmission distance reduced by reducing the size of passive components or by embedding passive components. Thus, extra space is created to accommodate active components and the overall performance of elements is improved, and thereby, the substrate structure of embedded passive components resistors, capacitors, and inductors) has been developed.

However, the electrical quality of the elements embedded in the inner layer is critical in designing a circuit module with desirable electrical characteristics under this architecture. To achieve a high-density package, the gap between elements must be reduced. Therefore, after the embedded elements are embedded therein through many different ways, a number of stray parasitic effects will occur. Moreover, as an element gets closer and closer to elements (e.g., signal transmission lines, capacitors, and inductors) in the layers above and below, and as more composite materials are used, the overall coupling effect inevitably increases, which causes cross talk phenomena such as signal distortion, and further influences signal integrity (SI).

In the conventional architecture of substrate with embedded elements, an overall metal layer or an overall metal mesh is typically used to form the overall metal shielding plane 120', as shown in FIG. 1 (dielectric layers are not shown in the figure for convenience of illustration). However, a large number of unnecessary parasitic effects 140 will thus occur due to the shielding plane, and parasitic capacitance is formed accordingly. Moreover, using overall metal layers or overall metal meshes wastes materials and occupies a large area.

For example, referring to U.S. Pat. No. 6,066,537, a plurality of vertical contact metals is disposed around a capacitor; next, a shielding diffusion block is formed in the substrate relative to the capacitor; then, the vertical contact metal is connected to the shielding diffusion block and to a ring-shaped metal wire connected to an external static voltage source; and thus, a shielding structure is formed around the capacitor. However, with this structure, the capacitor must pass around or pass through the shielding structure by means of a crossover line or a hole, so as to connect to external circuits. Therefore, though the capacitor can be effectively shielded, the high-frequency electrical characteristics thereof are destroyed due to the connection of the entire plane of metals, and a large area is occupied by the shielding structure.

Accordingly, to apply embedded elements in various circuits and to maintain the signal integrity, the elimination of coupling effects between elements is the most important object. Therefore, it is still a crucial issue for those skilled in the art to provide a shielding layout that is suitable for any embedded element, and has desirable electrical characteristics, and may be used to effectively prevent coupling effects.

SUMMARY OF THE INVENTION

According to one aspect of the invention, a mirror image shielding structure is disclosed in the present invention, which comprises an electronic element and a ground shielding plane below the electronic element, wherein the shape of the ground shielding plane is similar to the projection shape of the electronic element; the horizontal size of the ground shielding plane is greater than or equal to that of the electronic element.

Furthermore, the layout of the mirror image shielding structure can be achieved through various processes and materials such as semiconductor ICs, PCBs, ceramic substrates, nanometer processes, and micro electro-mechanical techniques.

Accordingly, it is an object of the present invention to provide a mirror image shielding structure for reducing the parasitic effect between the electronic element and the ground shielding plane.

Another object of the present invention is to provide a mirror image shielding structure for reducing the vertical coupling effect between electronic elements.

Another object of the present invention is to prevent the vertical impact on the signal integrity of the embedded elements caused by the layout of the transmission lines Features and examples of the present invention are illustrated in detail below through a most preferred embodiment with reference to the accompanied drawings.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and which thus is not limitative of the present invention, and wherein.

DETAILED DESCRIPTION OF THE INVENTION

Figure 1:
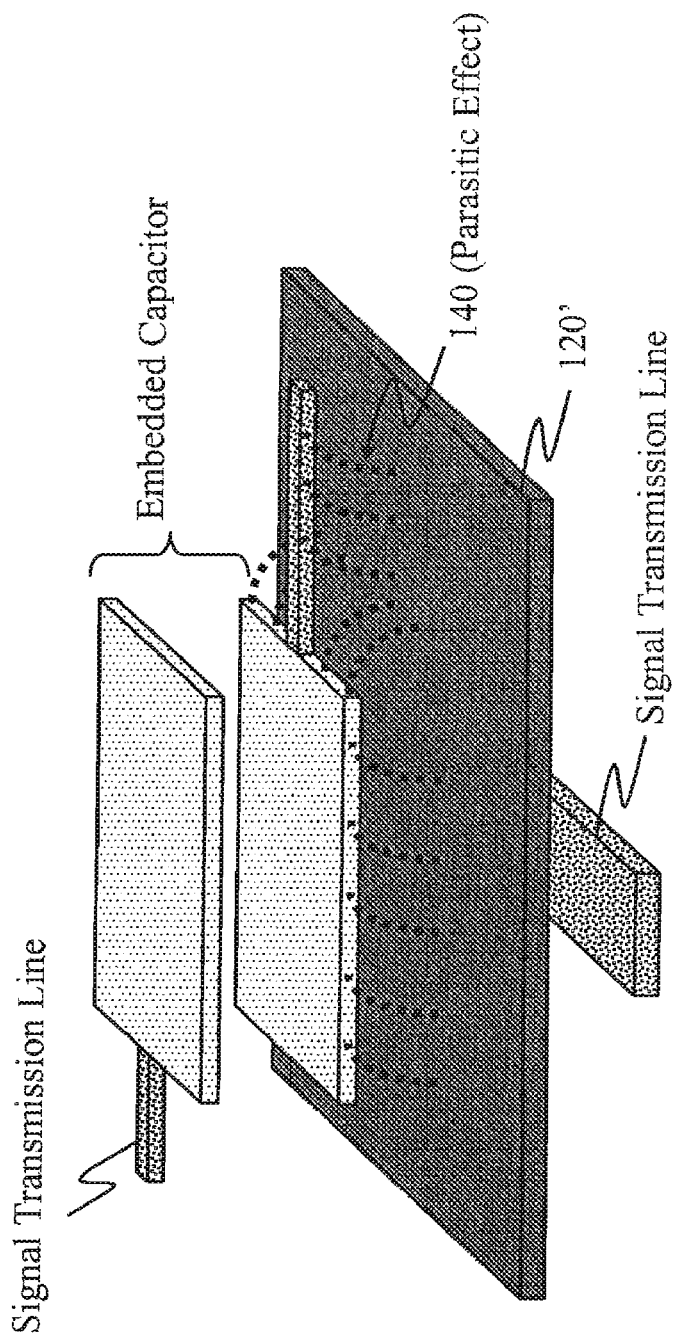
FIG. 1 is a stereogram of the conventional substrate architecture with embedded elements.

The content of the present invention is illustrated in detail below through specific embodiments with reference to accompanying drawings. Reference numerals mentioned in the specification refer to corresponding numbers in the drawings.

According to the present invention, two elements are isolated by a vertical metal shielding plane. In other words, the shape of the ground shielding plane can be similar to that of the vertical projection plane of the element, or that of the vertical projection plane of the element closest to the ground shielding plane.

FIGS. 2A, 2B, 2C, and 2D show the mirror image shielding structure of the present invention, which comprises a first electronic element 110 and a ground shielding plane 120. The ground shielding plane 120 is located under the first electronic element 110. The shape of the ground shielding plane 120 is similar to the projection shape of the first electronic element 110, and the horizontal size of the ground shielding plane 120 is greater than or equal to that of the first electronic element 110. Moreover, the electrical isolation between the ground shielding plane 120 and the first electronic element 110 can be achieved with a medium material 130 (i.e., the dashed-line part in the drawings can be filled with the medium material, which is not shown for convenience of illustration). The medium material 130 can be a composite material to enhance the electrical characteristics of the electronic element. Here, the first electronic element 110 can be a resistor (shown in FIG. 2A), a capacitor (shown in FIG. 2B), an inductor (shown in FIG. 2C), or a signal transmission line (shown in FIG. 2D) and so son. For example, if the electronic element is an inductor, the medium material can be a magnetic material; if the electronic element is a capacitor, the medium material can be a material with a high dielectric constant; and if the electronic element is a signal transmission line, the medium material can be a material with a low dielectric constant and low dielectric loss.

Here, the horizontal size of the ground shielding plane is preferred to be about 1.1 to 4 times of that of the electronic element.

Figure 3:
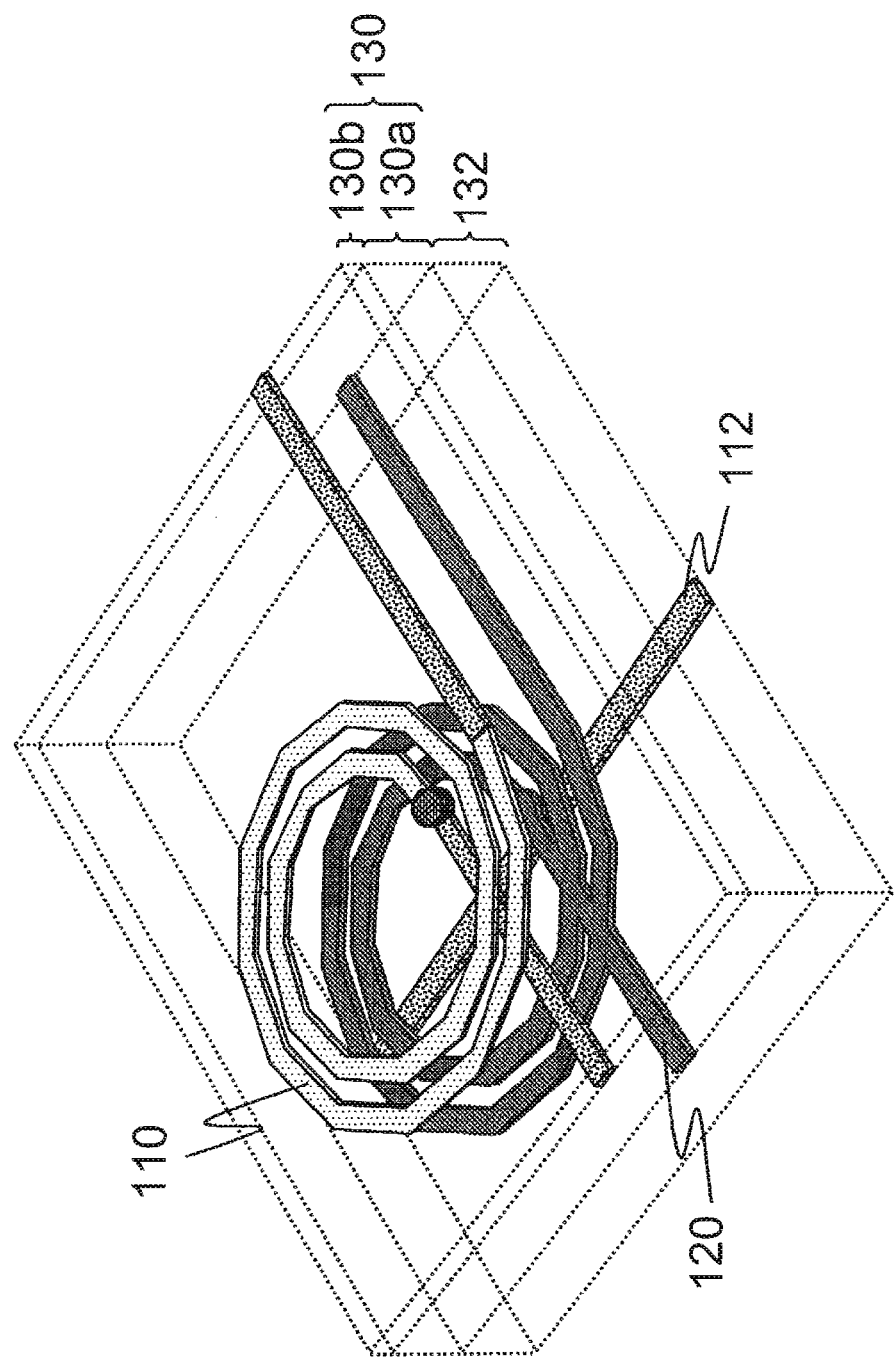
FIG. 3 is a stereogram of the minor image shielding structure according to a fifth embodiment of the present invention.

In addition, a second electronic element 112 is located under the ground shielding plane 120, as shown in FIG. 3. The second electronic element 112 can be a resistor, a capacitor, an inductor, a signal transmission line, a filter, a balanced/unbalanced converter, a coupler, or an antenna, etc. Furthermore, the electrical isolation between the ground shielding plane 120 and the first and second electronic elements 110, 112 can be achieved with medium materials 130 and 132 (i.e., the dashed-line part in the drawings can be filled with medium materials, which is not shown for convenience of illustration). The medium material 130 between the ground shielding plane 120 and the first electronic element 110 can be the same as or be different from the medium material 132 between the ground shielding plane 120 and the second electronic element 112.

Take the inductor as an example, referring to FIG. 3, it is assumed that the first electronic element 110 is an inductor, and the second electronic element 112 is a signal transmission line. The medium material 130 can be a composite material composed of a first medium 130a and a second medium 130b. The ground shielding plane 120 is located under the first medium 130a, and the second medium 130b is located between the first electronic element 110 and the first medium 130a. The shape of the ground shielding plane 120 is similar to the projection shape of the inductor (i.e., the first electronic element 110), and the horizontal size of the ground shielding plane 120 is greater than or equal to that of the inductor. The ground shielding plane 120 is electrically isolated from the signal transmission line (i.e., the second electronic element 112) with the medium material 132 below.

Figure 4:
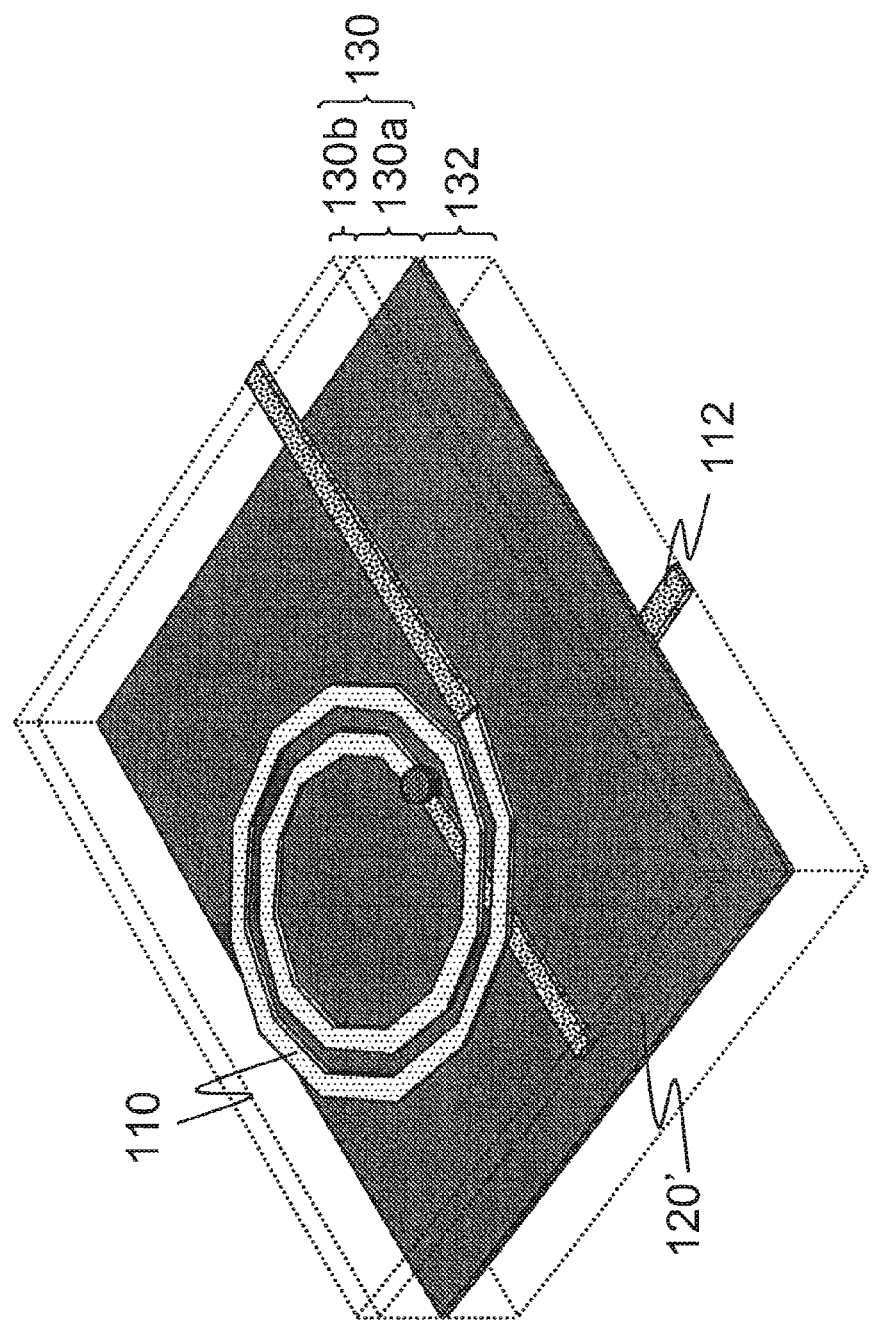
FIG. 4 is a stereogram of another conventional substrate architecture with embedded elements.
Figure 5:
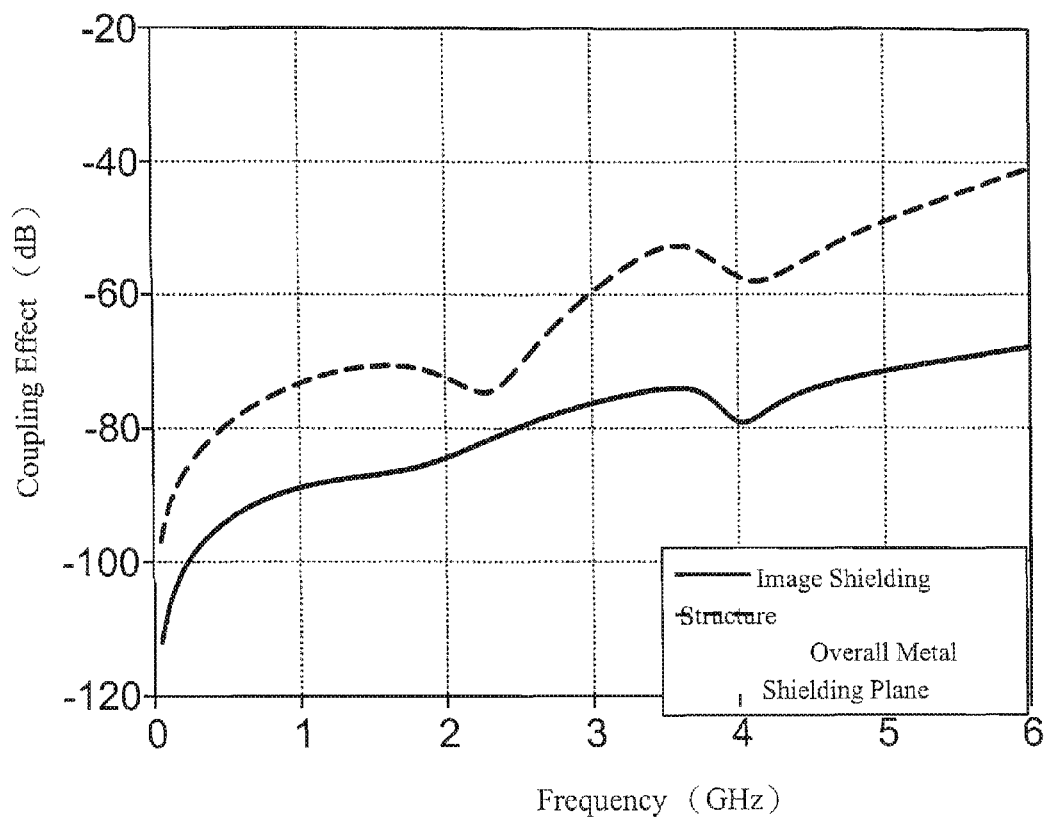
FIG. 5 shows the experimental simulation results of the coupling effect.
Figure 6A:
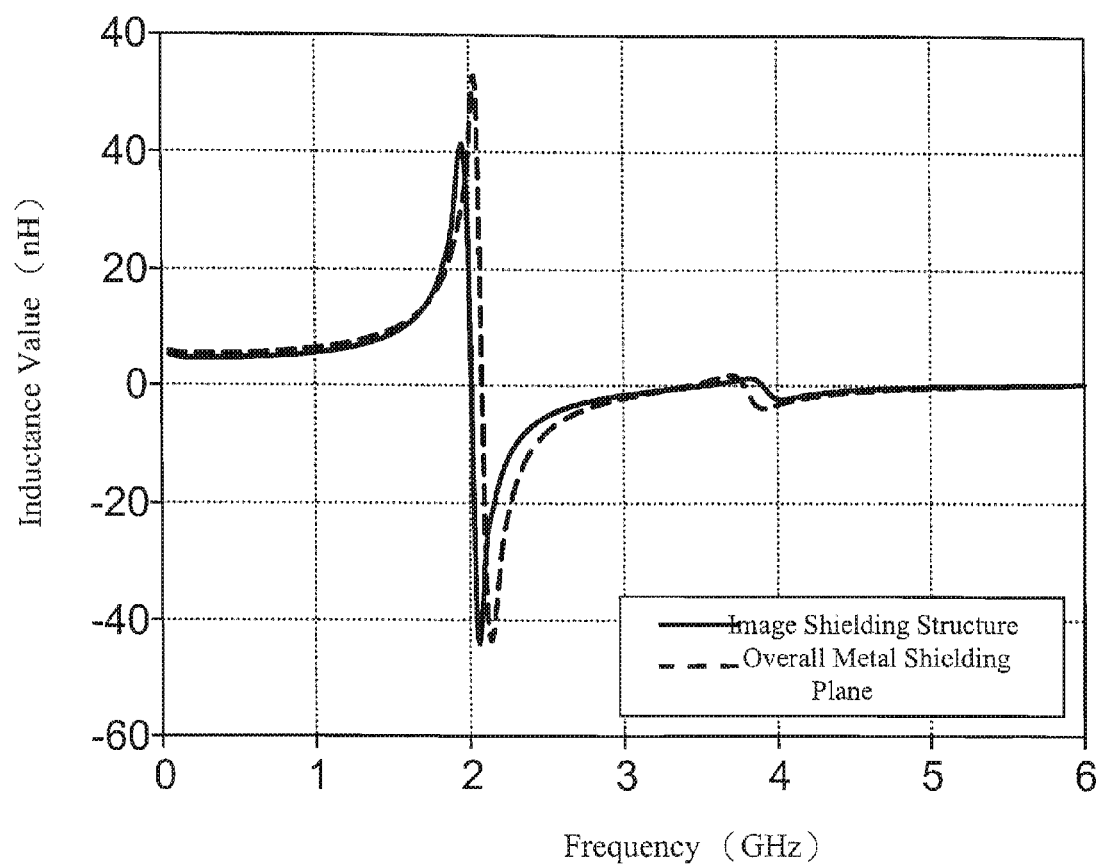
FIGS. 6A and 6B show the experimental simulation results of the shielding inductance values.
Figure 6B:
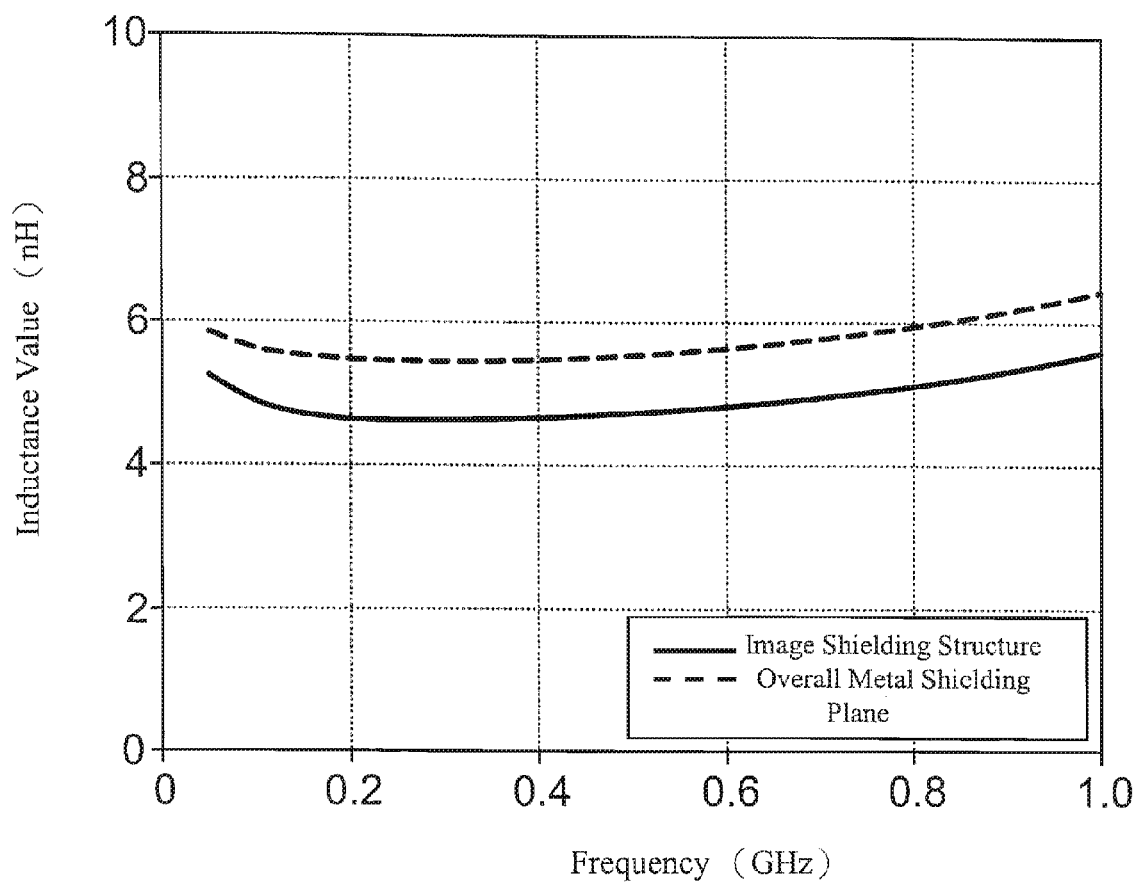
Figure 7:
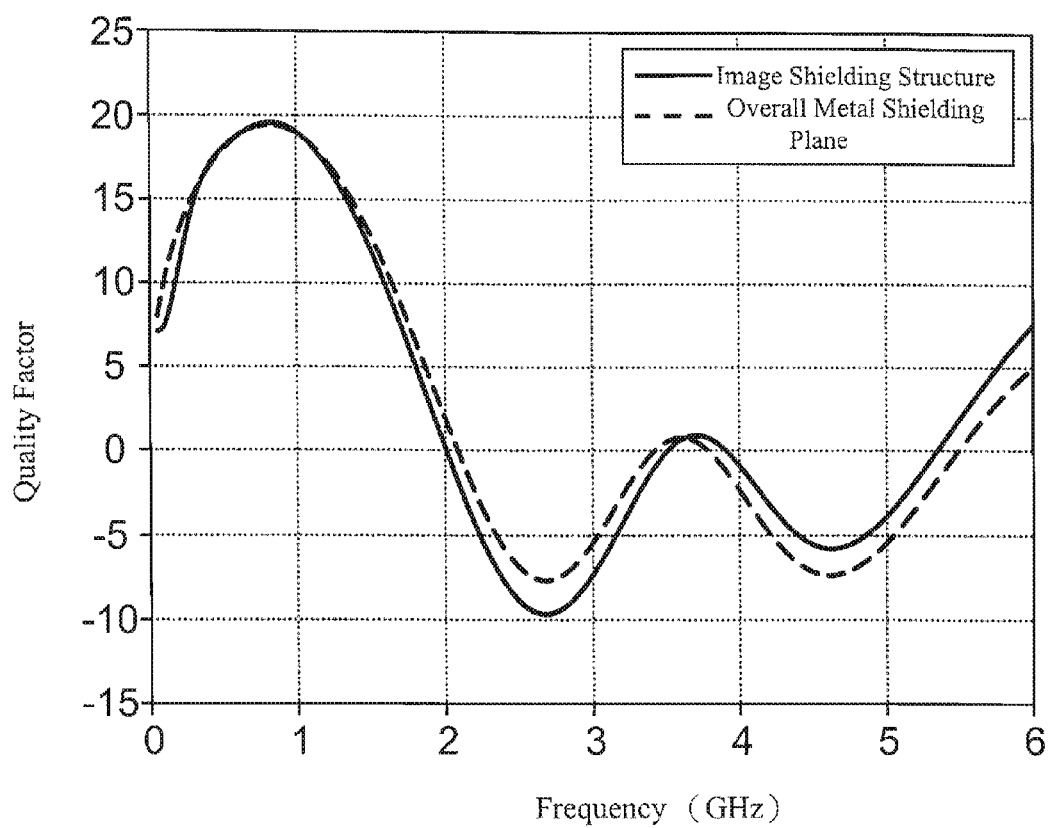
FIG. 7 shows the experimental simulation results of the quality factor (Q factor).

Here, experimental simulation is performed to the aforementioned architecture, wherein the inductors are spiral inductors with the wire width and wire distance of 5 mil (1/1000 inch); the first medium 130a has a thickness of about 2 mil, a dielectric constant (DK) of about 40, and a dissipation factor (DF) of about 0.04; the second medium 130b has a thickness of about 2 mil, a DK of about 3.2, and a DF of about 0.002 (e.g., a Rogers RO4403 material); and the medium material 132 has a thickness of about 20 mil, a DK of about 4.2, and a DF of about 0.04 (e.g., a glass fiber board (FR4)). The shape of the ground shielding plane 120 of the present invention is similar to the projection shape of the inductor (i.e., the first electronic element 110), and the horizontal size of the ground shielding plane 120 is greater than or equal to that of the inductor, as shown in FIG. 3. The conventional shielding structure utilizes the overall metal shielding plane 120', as shown in FIG. 4. According to the experimental simulation results, the ground shielding plane of the present invention can be used to effectively reduce the coupling effect (e.g., cross talk) to lower than −40 dB, which meets the isolation requirements, as shown in FIG. 5; moreover, the mirror image shielding structure of the present invention uses the ground shielding plane, and has a higher shielding inductance value than the conventional shielding structure that uses the overall metal shielding plane, as shown in FIGS. 6A and 6B. Furthermore, with the reduced area of the shielding plane, the quality factor (Q factor) of the mirror image shielding structure of the present invention is equivalent to that of the conventional shielding structure with the overall metal shielding plane, as shown in FIG. 7. The mirror image shielding structure of the present invention reduces the material cost and the occupied area, thereby effectively avoiding the unnecessary parasitic effect and the vertical coupling effect. In addition, the vertical impact on the signal integrity (SI) of the embedded elements caused by the layout of the transmission lines is also avoided.

Figure 2A:
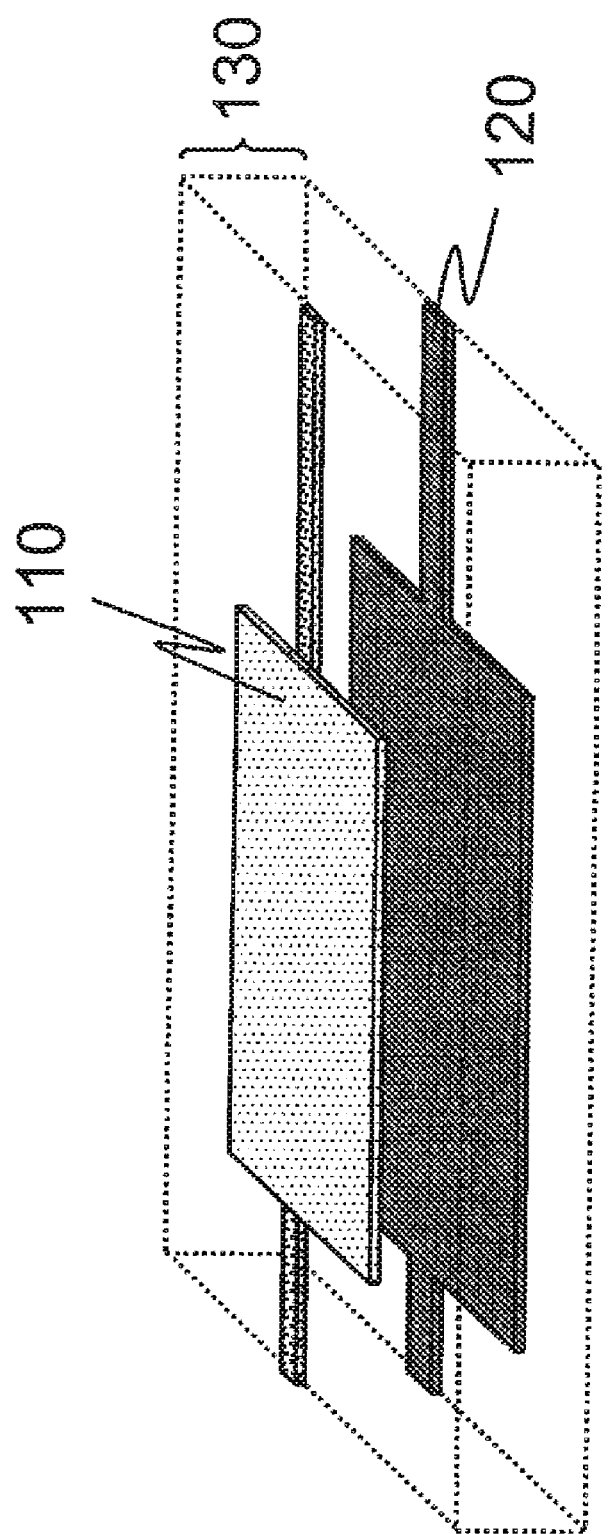
FIG. 2A is a stereogram of the mirror image shielding structure according to a first embodiment of the present invention.
Figure 2B:
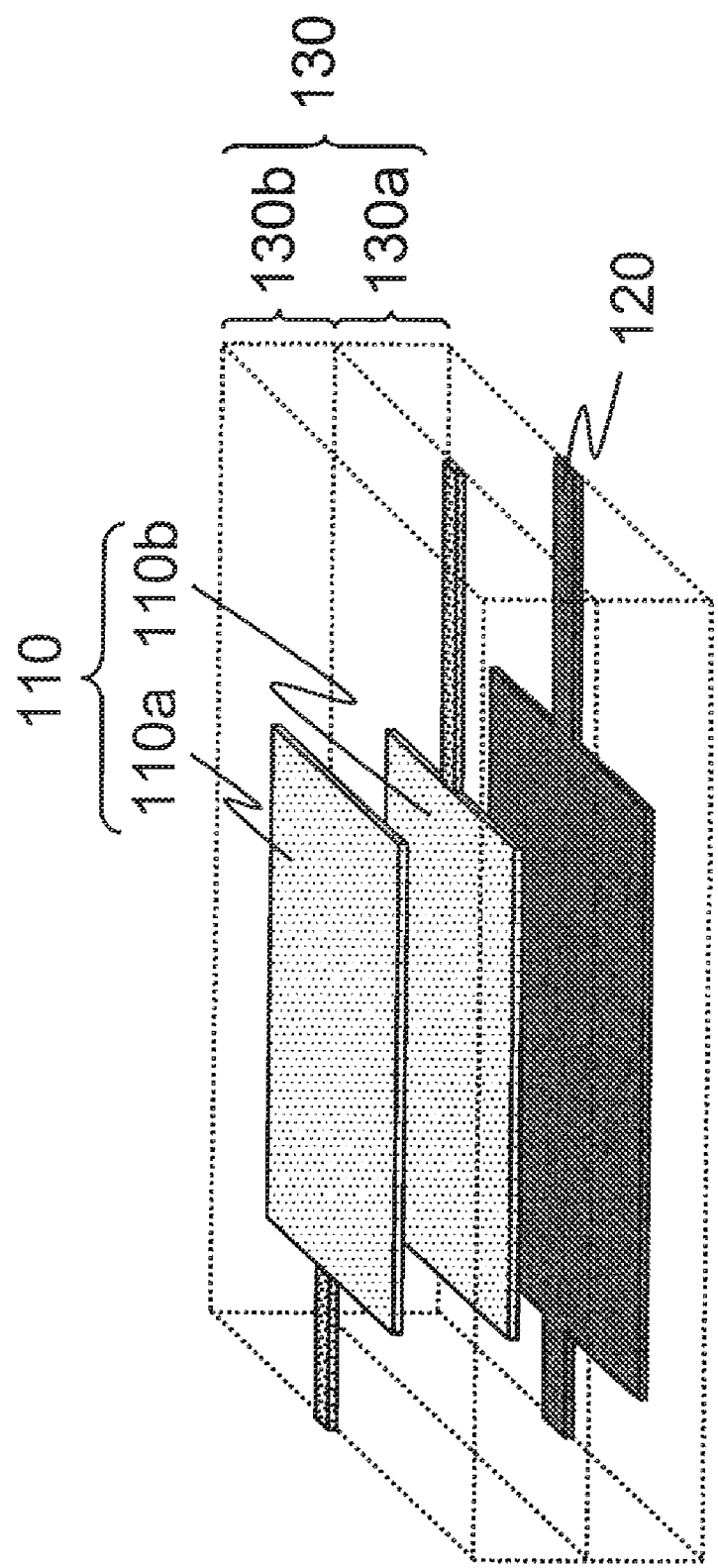
FIG. 2B is a stereogram of the mirror image shielding structure according to a second embodiment of the present invention.
Figure 2C:
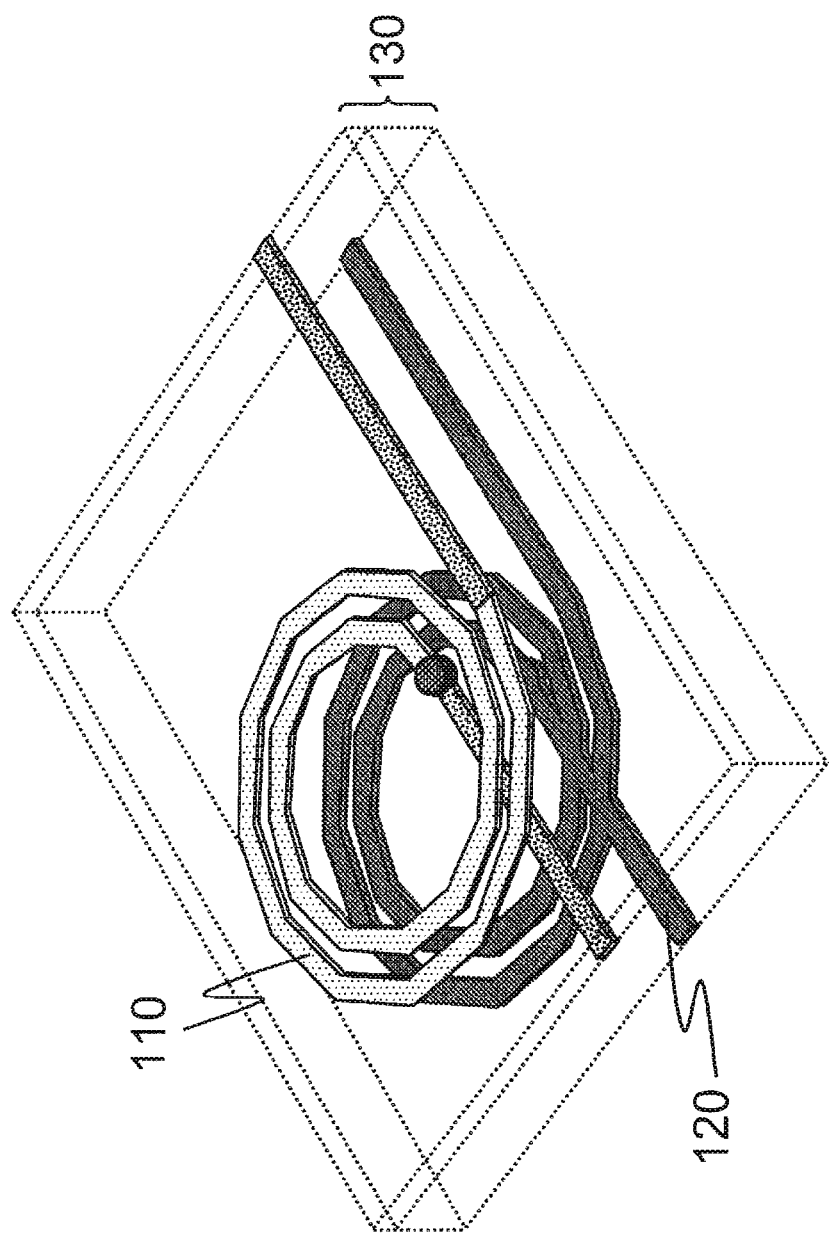
FIG. 2C is a stereogram of the minor image shielding structure according to a third embodiment of the present invention.
Figure 2D:
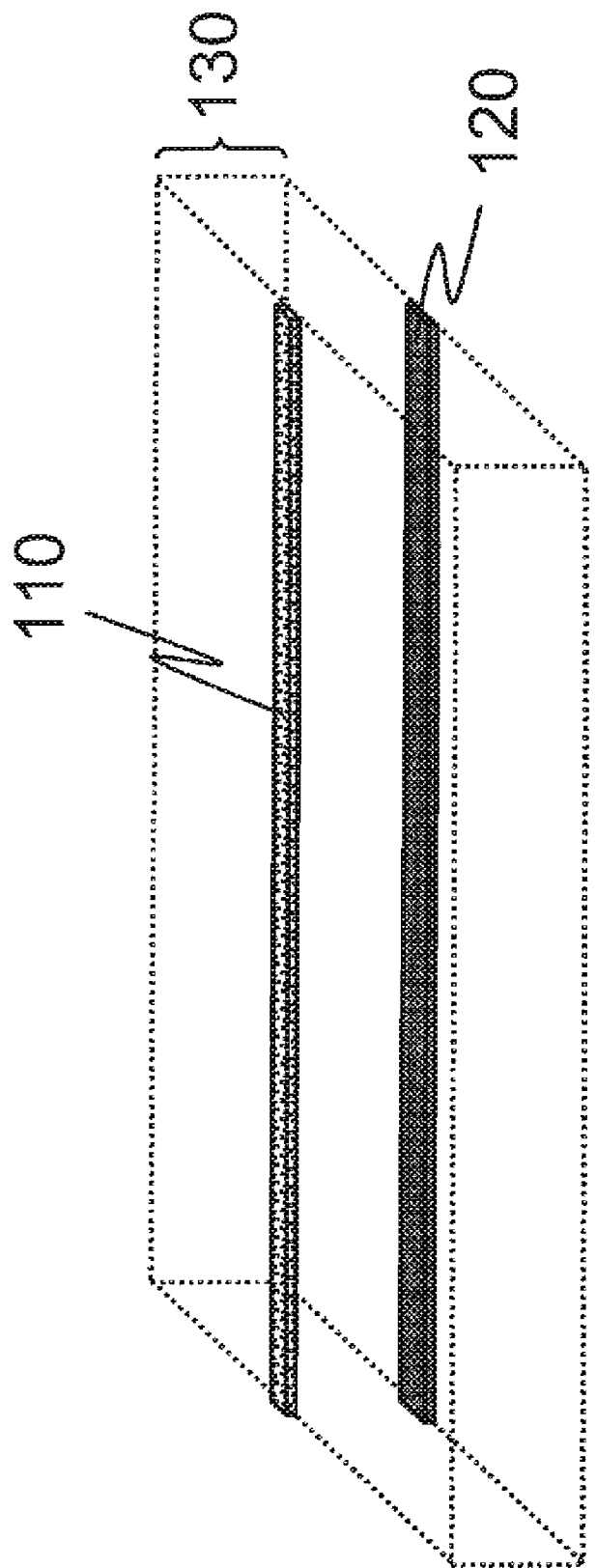
FIG. 2D is a stereogram of the mirror image shielding structure according to a fourth embodiment of the present invention.

Moreover, the first electronic element 110 can be composed of a plurality of sub-components 110a and 110b, as shown in FIG. 2B. The shape of the ground shielding plane 120 is similar to the projection shape of the first electronic element 110, and the horizontal size of the ground shielding plane 120 is greater than or equal to that of the first electronic element 110. Moreover, the electrical isolation between the ground shielding plane 120 and the first electronic element 110 can be achieved with a medium material 130. The medium material 130 can be a composite material to enhance the electrical characteristics of the electronic element. Here, the medium material 130 can be a composite material composed of a first medium 130a and a second medium 130b. The first medium 130a is located between the sub-component 110b and the ground shielding plane 120, and the second medium 130b is located between the sub-components 110a and 110b. The first medium 130a and the second medium 130b can be of the same or different materials.

Taking the capacitor as an example, it is assumed that the first electronic element 110 is a capacitor; and the sub-components 110a and 110b thereof are metal sheets. That is, the capacitor is formed of two metal sheets, coupled to each other. Meanwhile, the second medium 130b can use a material with a high dielectric constant to enhance the electrical characteristics of the first electronic element 110.

Figure 8:
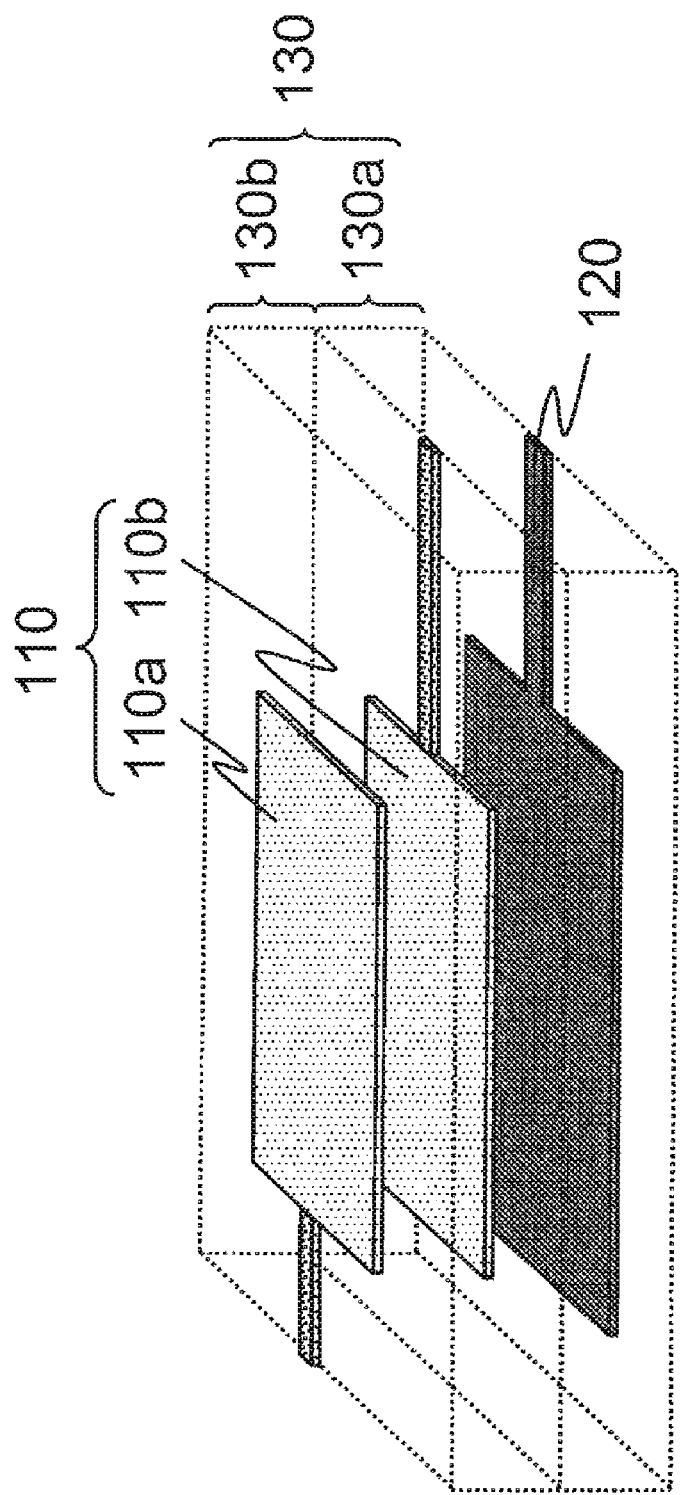
FIG. 8 is a stereogram of the mirror image shielding structure according to a sixth embodiment of the present invention.

In addition, the shape of the ground shielding plane 120 also need only be similar to the projection shape of the sub-component 110b closest to the ground shielding plane 120, and the horizontal size of the ground shielding plane 120 is greater than or equal to that of the sub-component 110b closest to the ground shielding plane 120, as shown in FIG. 8.

Here, the horizontal size of the ground shielding plane is preferred to be 1.1 to 4 times of that of the sub-component closest to the ground shielding plane.

Figure 9:
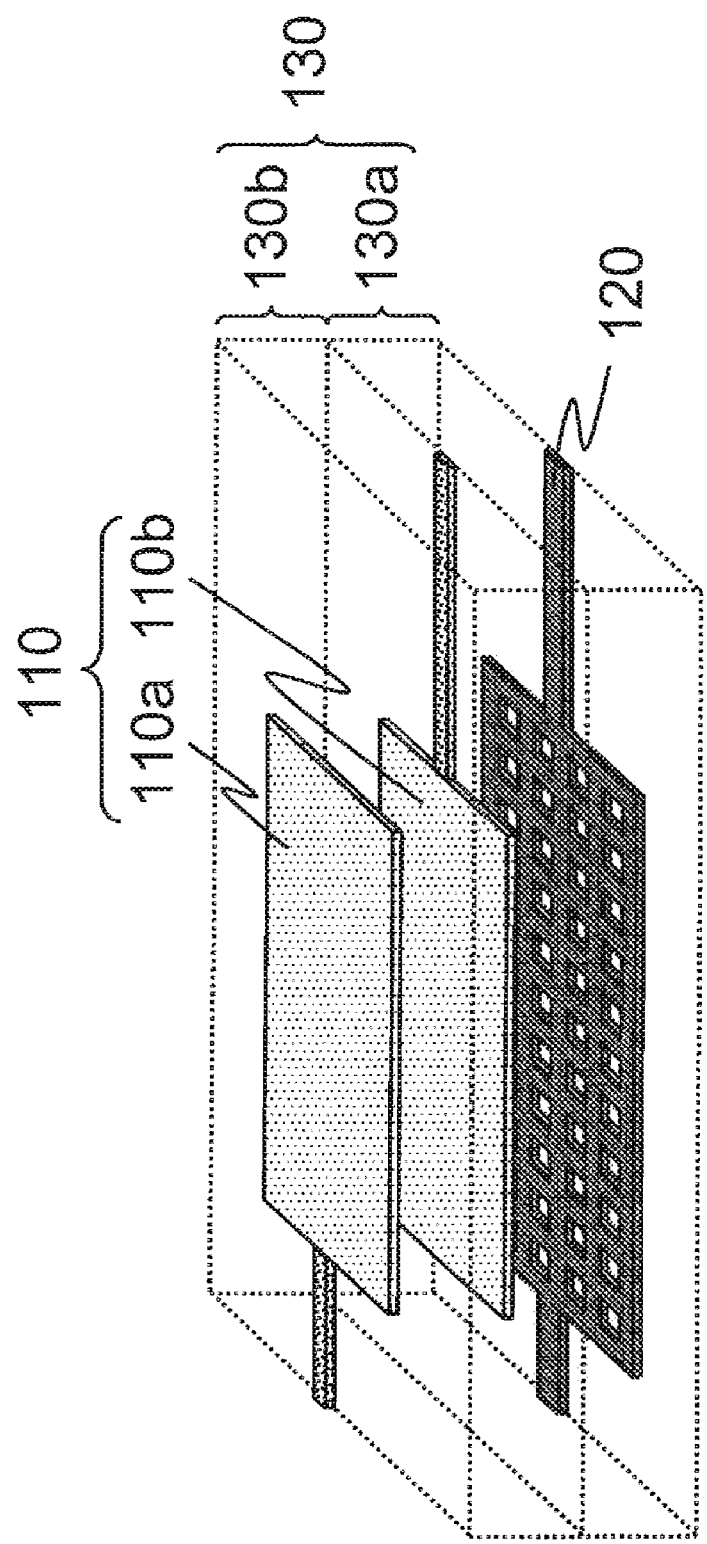
FIG. 9 is a stereogram of the mirror image shielding structure according to a seventh embodiment of the present invention.

Furthermore, the ground shielding plane 120 can be a metal sheet (shown in FIG. 2B) or a metal mesh (shown in FIG. 9).

Thus, the parasitic effect between the electronic elements and the ground shielding plane is significantly reduced, and the vertical coupling effect between the electronic elements is also reduced. Furthermore, the vertical impact on the signal integrity of the embedded elements caused by the layout of the transmission lines is prevented. In addition, the layout of the mirror image shielding structure can be achieved by various processes and materials such as semiconductor ICs, PCBs, ceramic substrates, nanometer processes, and micro electro-mechanical techniques.

The invention being thus described, it will be obvious that the same can be varied in many ways. Such variations are not to be regarded as a departure from the spirit and scope of the invention, and all such modifications as would be obvious to one skilled in the art are intended to be included within the scope of the following claims.

What is claimed is:

1. A mirror image shielding structure, comprising:
   a first electronic element, comprising a plurality of sub-components, wherein the first electronic element is one of resistors, capacitors, inductors, filters, balanced/unbalanced converters, and couplers;
   a ground shielding plane, parallel to the first electronic element, aligned and located under the first electronic element; and
   a first medium, being between the first electronic element and the ground shielding plane for electrically isolating the first electronic element with the ground shielding plane, wherein the first electronic element and the ground shielding plane are not connected to each other, the ground shielding plane is patterned according to the first electronic element such that the shape of the ground shielding plane is identical to the projection shape of the first electronic element and extending in the same directions at both ends of the first electronic element, and the horizontal size of the ground shielding plane is greater than or equal to that of the first electronic element.

2. The mirror image shielding structure as claimed in claim 1, wherein the ground shielding plane is selected from the group consisting of metal sheet and metal meshes.

3. The mirror image shielding structure as claimed in claim 1, wherein the sub-components are metal sheets.

4. The mirror image shielding structure as claimed in claim 3, further comprising:
   a second medium, being between the sub-components for electrically isolating the sub-components with each other.

5. The mirror image shielding structure as claimed in claim 4, wherein the second medium is a material with a high dielectric constant to enhance the electrical characteristics of the first electronic element.

6. The mirror image shielding structure as claimed in claim 5, wherein the horizontal size of the ground shielding plane is in between 1.1 to 4 times to that of the first electronic element.

7. The mirror image shielding structure as claimed in claim 6, wherein the ground shielding plane is selected from the group consisting of metal sheet and metal meshes.

8. The mirror image shielding structure as claimed in claim 1, further comprising:
   a second medium, being between the sub-components for electrically isolating the sub-components with each other.

9. The mirror image shielding structure as claimed in claim 8, wherein the second medium is a material with a high dielectric constant to enhance the electrical characteristics of the first electronic element.

10. The mirror image shielding structure as claimed in claim 1, wherein the horizontal size of the ground shielding plane is in between 1.1 to 4 times to that of the first electronic element.

11. The mirror image shielding structure as claimed in claim 1, wherein the ground shielding plane is patterned according to the sub-component closes to the ground shielding plane such that the shape of the ground shielding plane is identical to the projection shape of the sub-component closest to the ground shielding plane, and the horizontal size of the ground shielding plane is greater than or equal to that of the sub-component closest to the ground shielding plane.

12. The mirror image shielding structure as claimed in claim 11, wherein the sub-components are metal sheets.

13. The mirror image shielding structure as claimed in claim 12, further comprising:
   a second medium, being between the sub-components for electrically isolating the sub-components with each other.

14. The mirror image shielding structure as claimed in claim 13, wherein the second medium is a material with a high dielectric constant to enhance the electrical characteristics of the first electronic element.

15. The mirror image shielding structure as claimed in claim 14, wherein the horizontal size of the ground shielding plane is in between 1.1 to 4 times to that of the first electronic element.

16. The mirror image shielding structure as claimed in claim 15, wherein the ground shielding plane is selected from the group consisting of metal sheet and metal meshes.

* * * * *